United States Patent
Schulz et al.

(10) Patent No.: US 11,366,181 B2
(45) Date of Patent: Jun. 21, 2022

(54) COMPONENT CARRIER WITH INTEGRATED FLUX GATE SENSOR

(71) Applicant: AT&S Austria Technologie & Systemtechnik Aktiengesellschaft, Leoben (AT)

(72) Inventors: Gernot Schulz, Graz (AT); Alexander Kasper, Graz (AT); Marco Gavagnin, Leoben (AT); Martin Lenzhofer, Klagenfurt/Viktring (AT); Michael Ortner, Villach (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 154 days.

(21) Appl. No.: 16/499,426

(22) PCT Filed: Mar. 29, 2018

(86) PCT No.: PCT/EP2018/058268
§ 371 (c)(1),
(2) Date: Sep. 30, 2019

(87) PCT Pub. No.: WO2018/178325
PCT Pub. Date: Oct. 4, 2018

(65) Prior Publication Data
US 2020/0041582 A1 Feb. 6, 2020

(30) Foreign Application Priority Data
Mar. 31, 2017 (EP) .................................. 17164386

(51) Int. Cl.
*G01R 33/05* (2006.01)
*G01R 33/00* (2006.01)
*H05K 1/16* (2006.01)

(52) U.S. Cl.
CPC ........ *G01R 33/05* (2013.01); *G01R 33/0029* (2013.01); *G01R 33/0052* (2013.01); *H05K 1/165* (2013.01)

(58) Field of Classification Search
CPC G01R 33/05; G01R 33/0029; G01R 33/0052; G01R 33/04; H05K 1/165
See application file for complete search history.

(56) References Cited

U.S. PATENT DOCUMENTS 6,270,686 B1  8/2001  Tamura
6,429,651 B1 * 8/2002  Choi ..................... G01R 33/04
                                                           324/225

(Continued)

FOREIGN PATENT DOCUMENTS

CN  200941115 Y  8/2007
CN  101228453 A  7/2008

(Continued)

OTHER PUBLICATIONS

Loughman, J.; Communication in Application No. 17164386.9; pp. 1-5; Dec. 8, 2020; European Patent Office; 80298, Munich, Germany.

(Continued)

*Primary Examiner* — Akm Zakaria
(74) *Attorney, Agent, or Firm* — Robert A. Blaha; Smith Tempel Blaha LLC

(57) ABSTRACT

A component carrier with an integrated magnetic field sensor is disclosed. The component carrier includes a plurality of electrically conductive layer structures and/or electrically insulating layer structures; an excitation coil and sensor coils arranged on and/or in the layer structures; a first magnetic structure above the excitation coil and sensor coils; and a second magnetic structure below the excitation coil and sensor coils.

17 Claims, 10 Drawing Sheets

(56) References Cited

U.S. PATENT DOCUMENTS

| | | | |
|---|---|---|---|
| 7,372,261 B2* | 5/2008 | Choi | G01R 33/04 |
| | | | 324/253 |
| 8,742,518 B2* | 6/2014 | Wang | G11C 11/161 |
| | | | 257/421 |
| 2001/0029662 A1 | 10/2001 | Uriu et al. | |
| 2002/0056202 A1 | 5/2002 | Tamura | |
| 2002/0167783 A1 | 11/2002 | Waffenschmidt et al. | |
| 2003/0169038 A1 | 9/2003 | Kang et al. | |
| 2004/0027121 A1 | 2/2004 | Choi et al. | |
| 2004/0169509 A1* | 9/2004 | Czipott | G01V 3/08 |
| | | | 324/246 |
| 2006/0001422 A1 | 1/2006 | Kang et al. | |
| 2012/0126799 A1 | 5/2012 | Schatz et al. | |
| 2013/0057276 A1 | 3/2013 | Klein | |
| 2014/0117980 A1* | 5/2014 | Ely | G01B 7/30 |
| | | | 324/207.17 |
| 2015/0171157 A1* | 6/2015 | Sturcken | H01L 23/5223 |
| | | | 257/531 |
| 2015/0276894 A1 | 10/2015 | Ricotti et al. | |
| 2016/0282421 A1* | 9/2016 | Krishnamurthy | G06F 30/367 |
| 2018/0052065 A1* | 2/2018 | Sipila | G01L 3/102 |

FOREIGN PATENT DOCUMENTS

| | | | | |
|---|---|---|---|---|
| CN | 101427394 | A | 5/2009 | |
| CN | 101672901 | A | 3/2010 | |
| CN | 102159037 | A | 8/2011 | |
| CN | 205232575 | U | 5/2016 | |
| CN | 106471619 | A | 3/2017 | |
| DE | 10 220 981 | A1 | 10/2003 | |
| DE | 10330101 | A1 | 8/2004 | |
| DE | 10 220 982 | B4 | 1/2007 | |
| DE | 10 220 983 | B4 | 1/2007 | |
| DE | 10 2004 052 909 | B4 | 11/2007 | |
| EP | 1 345 036 | A2 | 9/2003 | |
| EP | 1 345 037 | A2 | 9/2003 | |
| EP | 1 387 179 | A2 | 2/2004 | |
| EP | 2 194 391 | A1 | 6/2010 | |
| JP | H02236181 | A | 9/1990 | |
| KR | 101 607 025 | B1 * | 4/2016 | G01R 15/18 |

OTHER PUBLICATIONS

Office Action in Application No. 201880028637.8 in China; pp. 1-9; Mar. 25, 2021; China National Intellectual Property Administration; No. 6, Xitucheng Lu, Jimenqiao Haidian District, Beijing City, 100088, China.

Translation of Cover page of Office Action in Application No. 201880028637.8 in China; pp. 1-3; Mar. 25, 2021; China National Intellectual Property Administration; No. 6, Xitucheng Lu, Jimenqiao Haidian District, Beijing City, 100088, China.

* cited by examiner

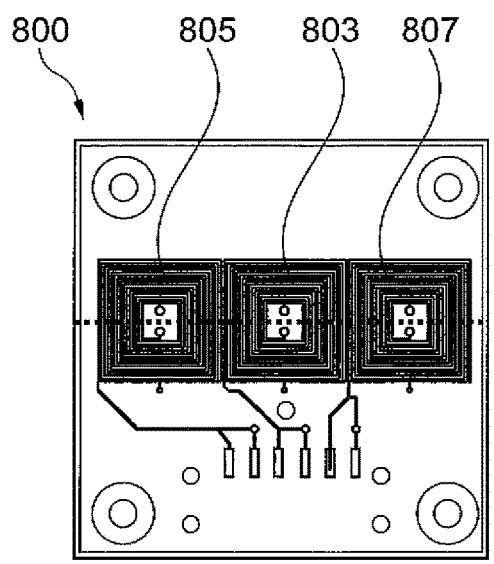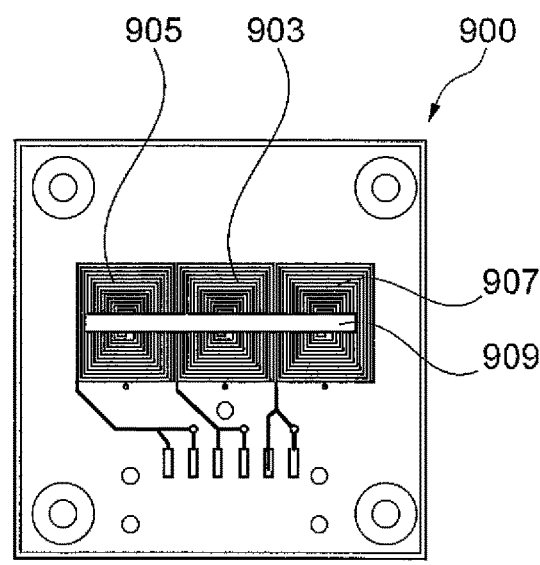
Fig. 8          Fig. 9
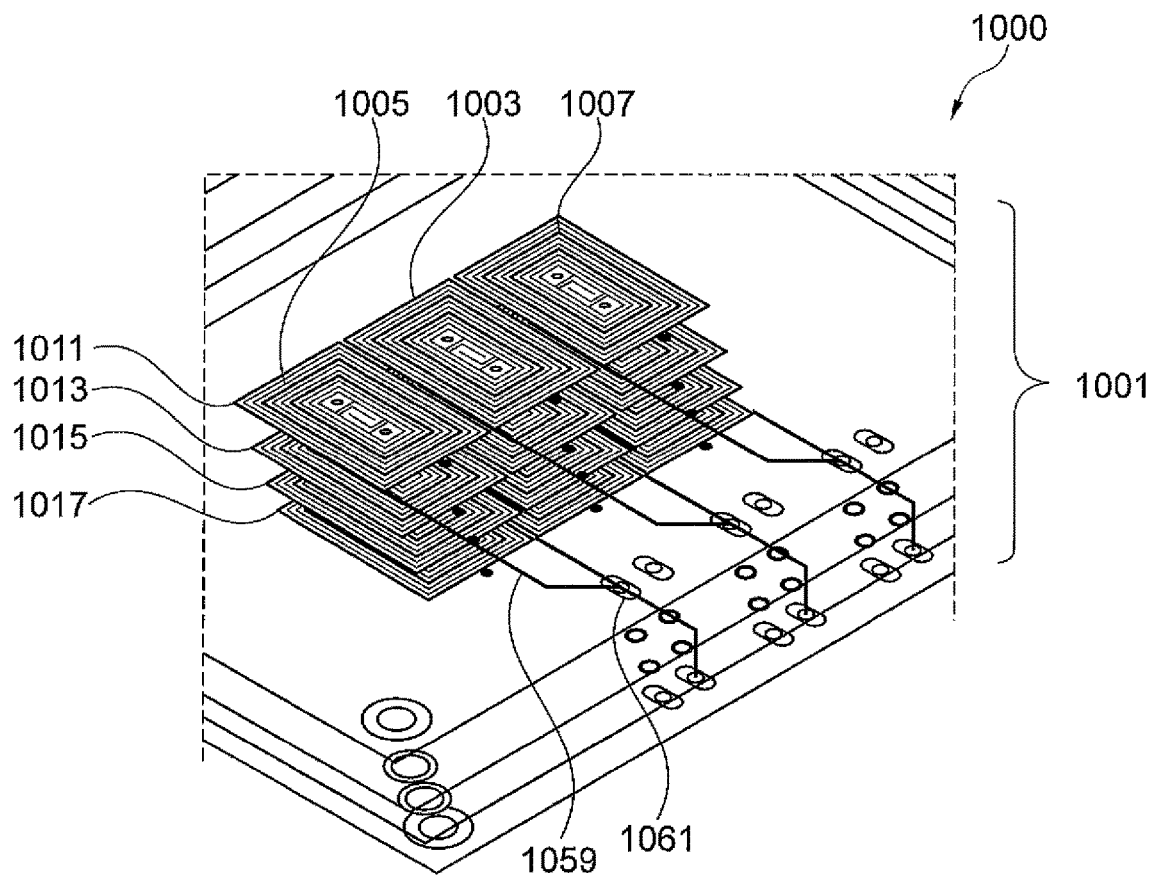
Fig. 10

COMPONENT CARRIER WITH INTEGRATED FLUX GATE SENSOR

CROSS-REFERENCE TO RELATED APPLICATIONS

The present application is a national phase application derived from international patent application no. PCT/EP2018/058268898, filed on Mar. 29, 2018, which benefits form the filing date of European patent application no. EP 17164386.9, filed Mar. 31, 2017, both applications of which are incorporated herein by reference in their respective entirety.

TECHNICAL FIELD

Embodiments of the present invention relates to a component carrier with an integrated flux gate sensor and further relates to a manufacturing method for manufacturing a component carrier with integrated flux gate sensor.

TECHNOLOGICAL BACKGROUND

A conventional planar flux gate sensor comprises a magnetic core of a generally elongated shape overlying an energizing coil. By supplying the energizing coil with an appropriate AC excitation current, it is possible to bring the magnetic core into a series of cycles of magnetic saturation. Sensing of external fields is obtained via a pair of sensing coils, generally set underneath the ends of the magnetic core.

EP 2 194 391 A1 discloses a broad range magnetic sensor and manufacturing process thereof, wherein the magnetic sensor is formed by a flux gate sensor and by at least one hall sensor. Therein, the magnetic core of the flux gate sensor is formed by a magnetic region that operates also as a concentrator for the hall sensor. The magnetic region is manufactured in a post-machining stage on the metallization layers wherein the energizing coil and sensing coil of the flux gate sensor are formed. The energizing and sensing coils are formed on a semiconductor substrate housing the conductive regions of the hall sensor. The flux gate sensor described in EP 2 194 391 A1 comprises an energizing coil overlying four sensing coils and underlying a magnetic core. The energizing coil is generally square-shaped and the magnetic core is cross-shaped and includes a first arm and a second arm, perpendicular to one another. The sensing coils are set in pairs with vertical axes passing in the proximity of the ends of the arms of the magnetic core. If the energizing coil is supplied with an appropriate excitation current, able to cause saturation of the magnetic material at an appropriate frequency, the two halves of the first arm are magnetized in opposite directions. In the absence of an external magnetic field, the two sensing coils experience two equal and zero induced voltages, if they have been connected in a differential configuration. Instead, if an external magnetic field is present, a first half of the first arm is magnetized in the same direction as the external field, thus amplifying its own total magnetization, whereas a second half of the first arm is magnetized in an opposite direction and its total magnetization is reduced. It follows that the differential voltage of the sensing coil is non-zero and is amplitude-modulated by the intensity of the external field. Thereby, an external field can be measured with high sensitivity and high reliability. The presence of a second arm enables to measure components of an external field in two directions and presence of a further arm perpendicular to the two arms further enables to measure components of the external field in three for example perpendicular directions, thereby enabling a 3D flux gate sensor.

DE 10 2004 052 909 A1 discloses a printed circuit board having a sensor for a weak magnetic field, comprising a base plate on which a first circuit is formed for excitation and a first circuit is formed for detection, bodies having a soft magnetic core which are laminated above and below the base plate and which are formed from a plurality of soft magnetic cores, and further comprising outer layers which are respectively laminated onto the bodies having the soft magnetic core and on which a second circuit for the excitation and a second circuit of the detection are formed.

U.S. Pat. No. 6,270,686 B1 discloses a weak-field magnetic field sensor having etched circuit coils, including an amorphous core having epoxy bases stacked relative to one another on top and bottom surfaces thereof. One epoxy base has a coil Y etched thereon, a second epoxy base has a coil X etched thereon and the remaining epoxy base has circular patterns etched thereon. The amorphous core is formed from at least two amorphous thin boards stacked on opposite sides of an epoxy base thin board.

The conventional flux gate sensor or generally sensors for detecting a magnetic field may require a voluminous space, may not be reliable in all conditions and may not have a sufficient accuracy or may not have a desirable sensitivity.

Thus, there may be a need for a magnetic field sensor, in particular a flux gate sensor, or generally a magnetic field sensor which requires less space, has a better reliability, an improved accuracy and/or an improved sensitivity. Furthermore, there may be a need for a flux gate sensor having an improved energy efficiency, in particular requiring less energy or having a smaller energy consumption for operation.

SUMMARY

This need may be solved by the subject-matter of the independent claims. The dependent claims specify particular embodiments of the present invention.

According to an embodiment it is provided a component carrier with integrated magnetic field sensor (e.g. magnetometer), in particular (planar) fluxgate sensor, wherein the component carrier comprises a plurality of electrically conductive layer structures and/or electrically insulating layer structures; an excitation coil and sensor coils arranged on and/or in the layer structures; a first magnetic structure above the excitation coil and sensors coils; and a second magnetic structure below the excitation coil and sensors coils.

The magnetic field sensor may be configured to measure a magnetic field or magnetic flux in at least one direction, in particular to measure strength and direction of a magnetic field, and may be configured as a (planar) fluxgate sensor.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In an embodiment, the at least one electrically insulating layer structure comprises at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a soft magnetic element, in particular a ferromagnetic element, an antiferromagnetic element or a ferrimagnetic element, for instance a ferrite core or may be a paramagnetic element. However, the component may also be a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force, if desired accompanied by heat.

The component carrier may be configured to carry further electric and/or electronic components, such as resistances, capacitors, diodes, transistors, or integrated circuits. The flux gate sensor is capable of measuring at least one component of an external magnetic field, for example providing a 1D flux gate sensor. For achieving a 1D flux gate sensor, at least one excitation coil and two sensor coils or two windings of one sensor coil may be present. For achieving a 2D flux gate sensor, at least one excitation coil and four sensor coils (e.g. arranged in a plane) may be present. For achieving a 3D flux gate sensor, at least two excitation coils and six sensor coils may be present or an integrated field shaping element.

The excitation coil and the sensor coil may be realized for example by appropriately etched copper traces etched on the electrically insulating layer structures. The excitation coil and/or the sensor coil may be present on one or more of the electrically insulating layer structures. Portions of the excitation coil and/or the sensor coils on different layers may be electrically connected via through-holes or vias.

For a 1D flux gate sensor or a 2D flux gate sensor, the excitation coil and the sensor coil may substantially be arranged adjacent to each other side by side substantially in a same vertical height or position. For example, the excitation coil and the sensor coil or at least portions thereof may be formed on a same layer of the electrically insulating layers or layer structures. Thereby, manufacturing may be simplified. In one layer, the excitation coil and/or the sensor coil may for example comprise N windings, where N is more than 1, e.g. between 5 and 100 windings, in particular between 10 and 20 windings, for example 15 windings. The excitation coil and the sensor coils may for example be arranged in between M coils, where M is more than 1, e.g. between two and six or even greater, in particular four stacked layers. E.g. within a n-layer component carrier or PCB, a m-layer fluxgate may be integrated. The excitation coil and the sensor coils may be configured substantially in a same shape, for example configured as rectangular, circular or quadratic spirals. The windings may for example be formed as copper traces. The excitation coil and the sensor coils may for example be manufactured by etching a copper layer covering insulating layer structure.

The magnetic structures may be magnetizable and may for example comprise ferromagnetic or ferrimagnetic material. The magnetic structures usually do not have a permanent magnetic field or do not generally generate their own magnetic field but are magnetizable and highly permeable to magnetic fields. The excitation coil when supplied with an appropriate AC current, may generate a magnetic field in the first magnetic structure and also in the second magnetic structure during operation as a flux gate sensor. Herein, in the first magnetic structure as well as in the second magnetic structure, due to the relative arrangement of the excitation coil and the first magnetic structure and the second magnetic structure, magnetic fields may be generated (within the first magnetic structure and/or the second magnetic structure) which point in opposite directions as it is known from conventional planar flux gate sensors. Both, the first magnetic structure and also the second magnetic structure may be a continuous structure, for example each being integrally formed. The first magnetic structure and/or the second magnetic structure may be formed directly on one of the electrically insulating layer structures or may be pre-fabricated and may be attached to one of the electrically insulating layer structures. The first magnetic structure and/or second magnetic structure may have a similar or same thickness, for example between 1 μm and 500 μm, in particular between 10 μm and 100 μm or have different thicknesses depending on the respective material and/or the desired goal. The first magnetic structure and the second magnetic structure may be made of different materials and may have a same or a different shape. A vertical distance between the excitation coil and the sensor coils on one hand and the first magnetic structure may be substantially equal or at least similar to a vertical distance between the excitation coil and the sensor coils on one hand and the second magnetic structure on the other hand. The first magnetic structure and the second magnetic structure may sandwich the excitation coil and the sensor coils therebetween.

The first magnetic structure (also referred to as core plate) as well as the second magnetic structure may focus magnetic flux lines therein and in particular the second magnetic structure may contribute to enclosing the magnetic flux lines to concentrate them into the magnetic structures. By concentrating the magnetic flux lines within the first magnetic structure and/or the second magnetic structure, the energy required to drive the excitation coil to generate an alternating magnetic field may be reduced. Thereby, to achieve a similar sensitivity as a conventional flux gate sensor, less energy for driving the excitation coil may be required.

The first magnetic structure as well as the second magnetic structure may be configured as a foil or a sheet or plate primarily extending in a plane parallel to the electrically insulating layer structures of the component carrier. The first magnetic structure and/or the second magnetic structure may for example be made by cutting appropriate shapes from pre-fabricated foils which may be conventionally available or from conventionally available metal sheets, such as used for conventional transformers. Both, the first magnetic structure and the second magnetic structure may be highly magnetically permeable but may be characterized by different hysteresis curves.

According to an embodiment the excitation coil and the sensors coils are arranged at least partially coplanar on and/or in the layer structures, in particular adjacent to each other.

In the layer structures, the excitation coil and the sensor coils may substantially extend over a same vertical height. For example, the excitation coil may not be above or below the sensor coils but may be substantially in a same vertical range. When the excitation coil and/or the sensor coil are configured to extend over several layers of the insulating layer structures, at least portions of the excitation coil and portions of the sensor coils may be arranged coplanar to each other, in particular in a same layer of the electrically insulating layer structures, or on the electrically insulating layer structures. When the excitation coil and the sensor coils are at least partly coplanar to each other, they may be manufactured on a same layer, thereby simplifying the manufacturing.

According to an embodiment the first magnetic structure and/or the second magnetic structure is made of a soft magnet material having a high maximum DC magnetic permeability, in particular between $10^3$ and $10^6$ or between $10^5$ and $10^7$, the material in particular comprising a (poly) crystalline an amorphous, in particular cobalt-based, metal alloy, the material in particular comprising at least one of Co, Ni, Si, Fe, Mo, mu-metal, a type of MetGlas, a type of Vitrovac.

When the first magnetic structure and/or the second magnetic structure has a high magnetic permeability, they may efficiently focus magnetic field lines within the magnetic structures, thereby improving the sensitivity or reducing energy consumption.

According to an embodiment the first magnetic structure and/or the second magnetic structure are composed of different materials and/or are configured as a foil or sheet. It has been found by the inventor by performing measurements of the sensitivity and energy consumption that different materials for the first and second magnetic structure may improve sensitivity and/or lower energy consumption of the flux gate sensor.

According to an embodiment the material of the first magnetic structure is characterized by a steeper hysteresis curve than the material of the second magnetic structure, and/or a magnetizing field at which a permeability is maximal is smaller for the material of the first magnetic structure than for the material of the second magnetic structure, and/or a magnetic reversal loss is smaller for the material of the first magnetic structure than for the material of the second magnetic structure, and/or the material of the second magnetic structure requires a higher external field strength to reach magnetic saturation than the first magnetic structure. The first and second magnetic material may have different saturation magnetizations.

The first magnetic structure may for example be characterized by a hysteresis curve which essentially has a kink after a steep increase, wherein the kink substantially is located at a magnetization which essentially equals to the saturation magnetization. Thus, the material of the first magnetic structure may essentially reach saturation for a lower magnetizing field than the material of the second magnetic structure. Less energy may be required to reverse the magnetization of the material of the first magnetic structure than to reverse the magnetization of the material of the second magnetic structure. The magnetic permeability generally may change with a varying magnetizing field. The permeability of both the materials of the first magnetic structure as well as the second magnetic structure may, starting from a vanishing magnetizing field, may increase to adopt a maximum at a particular magnetizing field and may then decrease, as saturation of the magnetization is reached. The magnetic reversal loss may correspond to an area enclosed by the hysteresis curves of the respective materials. The magnetic reversal loss may be related to the energy required to magnetize the respective material or reverse its (saturated) magnetization.

The inventors found that when one of these properties of the material of the first and second magnetic structure is satisfied, and if further the shape of the first and second magnetic structure are appropriately selected or designed, the sensitivity can be increased or the energy consumption can be decreased. Selection of material and shape may lead to improved energy efficiency and/or sensitivity.

According to an embodiment the excitation coil, the first magnetic structure and the second magnetic structure are configured, in particular together with a driver circuitry for the excitation coil, such that the excitation coil generates an alternating magnetic field, in particular having a frequency between 1 and 200 kHz, further in particular between 10 and 100 kHz, that saturates a magnetization in the first magnetic structure, while not saturating the magnetization in the second magnetic structure. When the material of the second magnetic structure is not saturating during operation of the flux gate sensor, the sensitivity can be increased and/or the energy consumption can be reduced.

According to an embodiment at least one of the excitation coil and the sensor coils comprises conductive windings, in particular wound in a same sense, formed on one or more, in particular between 2 and 6, dielectric layers of the insulating layers. In n dielectric layers, m fluxgate layers may be integrated (e.g. m<n, wherein n is a natural number). The conductive windings may be configured as copper traces, for example comprising straight sections running perpendicular to each other to form for example a spiral. When the excitation coil and/or the sensor coils are arranged on more than one dielectric layer of the insulating layers, a higher inductivity can be achieved thereby improving sensitivity and/or accuracy and/or reducing energy consumption.

According to an embodiment the dielectric layers, in particular four dielectric layers, on which the windings of the excitation coil and the windings of the sensors coils are formed are the same dielectric layers, or some dielectric layers, in particular two layers, have formed thereon windings of the excitation coil and windings of the sensors coils, while other dielectric layers have formed thereon no windings of the excitation coil but windings of the sensors coils.

When the windings of the excitation coil and the windings of the sensor coils are formed on the same dielectric layer or same dielectric layers, the manufacturing may be simplified. The excitation coil may be comprised of electrically conductive windings on less layers than the electrically conductive windings of the sensing coils, for example if the magnetic field generated by the excitation coil drives the magnetization in the first magnetic structure in saturation. In this situation, on some of the dielectric layers portions of the excitation coil and portions of the sensing coil may commonly be arranged, in particular side by side. In other dielectric layers, only portions of the sensing coils may be arranged and which may be laterally larger than the portions of the sensing coil in the dielectric layers commonly used for harboring portions of the excitation coils as well as portions of the sensing coils. Thus, in this situation, the sensing coils may be formed from winding portions in different dielectric layers having different sizes. Thereby, the sensitivity may be improved.

According to an embodiment an area of a lateral extension of the first magnetic structure and/or an area of a lateral extension of the second magnetic structure is equal as or smaller than, in particular between 20% and 40% of, a sum of areas of lateral extensions of the excitation coil and the sensors coils.

The area of the lateral extensions may be selected, for example such that saturation of the magnetization in the first magnetic structure is achieved during operation, while saturation of the magnetization is not reached in the second magnetic structure. The lateral extension of the first magnetic structure and/or the second magnetic structure may be largest in the direction in which the component of the external magnetic field is to be detected. In direction perpendicular to these directions, the extension may be smaller (e.g. smaller than the extension of the coils), thereby saving material.

According to an embodiment a lateral shape of the first magnetic structure and/or the second magnetic structure substantially equals a shape of a lateral region, or a diminished lateral region, covered by the excitation coil and the sensors coils. The first magnetic structure and/or the second magnetic structure may completely overlap the excitation coil and the sensor coils in a projection perpendicular to the layer structures. Thereby, magnetic flux lines may be focused and concentrated within the first and the second magnetic structures. The lateral region covered by the excitation coil and the sensor coils may for example have a cross-shape, wherein for example corners or side edges of the excitation coil and the sensing coils are closest to each other.

According to an embodiment at least one of the excitation coil and the sensors coils has windings formed as one or more spiraled squares or rectangles, two of the sensor coils being arranged adjacent to the excitation coil such that lateral mid points of the two sensors coils are connectable by a straight line running through a lateral mid-point of the excitation coil, the straight line in particular running through corners of windings of the excitation coil or running through and perpendicular to side edges of windings of the excitation coil. Thereby, a compact arrangement may be achieved or an arrangement where the magnetic structures cover a higher area of windings of the coils.

According to an embodiment an amount of an extension of the first magnetic structure and/or the second magnetic structure along the straight line is between a distance of the lateral mid-points of the two sensor coils and a distance between ends of the two sensor coils along the straight line. It has been found in experiments that the extension of the first and/or the second magnetic structure is not necessary the same as the extension of the combination of the excitation coil and the (adjacent) sensing coils, but may be a little bit smaller to reach only mid-points of sensing coils being arranged each adjacent to the (central) excitation coil. Thereby, material may be saved, while the sensitivity and energy consumption are maintained as desired.

According to an embodiment the number of excitation coils is at least two, the number of sensors coils is at least six, wherein four of the sensors coils and one excitation coil are arranged substantially in a coplanar arrangement, the other two sensors coils and one other excitation coil are oriented perpendicular to the coplanar arrangement on the same electrically insulating layer structures in a region laterally beside the four sensor coils, the region being bend by substantially 90°.

Advantageously, a 3D flux gate sensor may be manufactured starting from layer structures having therein implemented in first region a first central excitation coil surrounded by first four sensing coils and having second region comprising a second central excitation coil flanked by two second sensing coils. The first magnetic structure may be present above the coils in the first region and also above the coils in the second region. Also, the second magnetic structure may be present below the coils in the first region and below the coils in the second region. Finally, the first region and the second region may be oriented perpendicular to each other by bending the layer structures about a bending line between the first region and the second region. Thereby, efficiently, a 3D flux gate sensor may be manufactured. In another configuration, two boards can be separately manufactured and afterwards re-connected in a perpendicular configuration. The reconnection might occur for example via soldering methods, bonding methods etc.

It should be understood that features, individually or in any combination, disclosed, described or explained for a component carrier may also be applied, individually or in any combination, to a method of manufacturing a component carrier according to an embodiment and vice versa.

According to an embodiment it is provided a method of manufacturing a component carrier with integrated fluxgate sensor, wherein the method comprises connecting a plurality of electrically conductive layer structures and/or electrically insulating layer structures; forming an excitation coil and sensors coils on and/or in the layer structures; forming a first magnetic structure to be above the excitation coil and sensors coils; forming a second magnetic structure to be below the excitation coil and sensors coils.

The component carrier may further comprise a component, in particular an electronic component, mounted on and/or embedded in the at least one electrically insulating layer structure and/or the at least one electrically conductive layer structure.

The component carrier may be selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier and a logic chip.

The at least one electrically conductive layer structure may comprise at least one of the group consisting of copper, aluminum, nickel, silver, gold, palladium, and tungsten, any of the mentioned materials being optionally coated with supra-conductive material such as graphene.

The at least one electrically insulating layer structure may comprise at least one of the group consisting of resin, in particular reinforced or non-reinforced resin, for instance epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide.

The component carrier may be shaped as a plate.

The component carrier may be configured as one of the group consisting of a printed circuit board, and a substrate.

The component carrier may be configured as a laminate-type component carrier.

Embodiments of the present invention are now described with reference to the accompanying drawings. The invention is not limited to the illustrated or described embodiments.

BRIEF DESCRIPTION OF THE DRAWINGS

FIGS. 8 and 9 schematically illustrate in an elevational view a component carrier having a 1D flux gate sensor according to an embodiment;

FIG. 10 schematically illustrates in a perspective view a component carrier with integrated flux gate sensor according to an embodiment;

DETAILED DESCRIPTION OF ILLUSTRATED EMBODIMENTS

Figure 1:
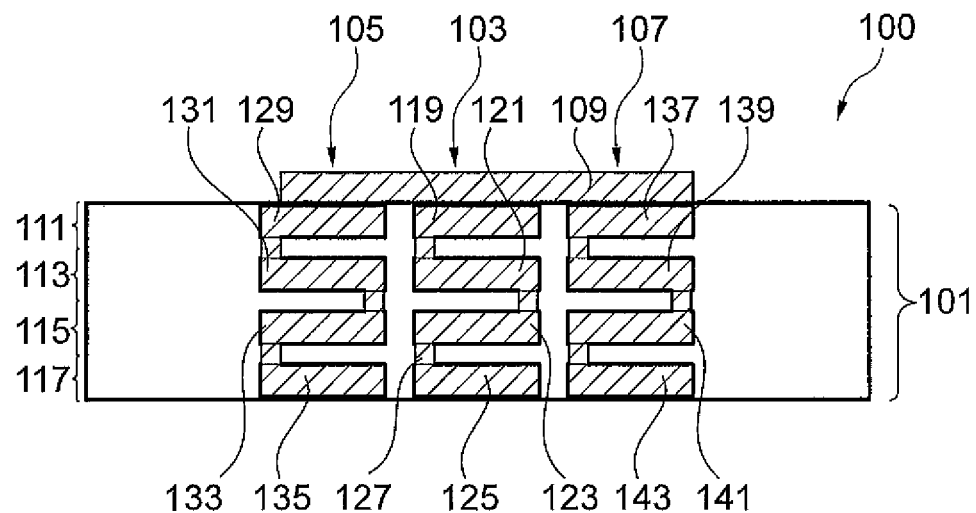
FIG. 1 schematically illustrates in a side view a component carrier according to an embodiment.

The component carrier 100 illustrated in a schematic side view in FIG. 1 comprises a plurality of electrically conductive layer structures and/or electrically insulating layer structures 101 which are stacked on top of each other and connected to each other after pressing them together and applying appropriate temperature. The layer structures may comprise pre-impregnated material comprising resin and fibers which may have structures thereon, electrically conductive copper traces for example. The component carrier 100 further comprises an excitation coil 103 and sensor coils 105 and 107 arranged within the stack of layer structures 101. The component carrier further comprises a first magnetic structure 109 above the excitation coil 103 and the sensor coil 105, 107.

In the example illustrated in FIG. 1, the stack 101 of layers comprises a first layer 111, a second layer 113, a third layer 115 and a fourth layer 117 which are stacked on top of each other and connected to each other. Portions of each of the excitation coil 103, the sensing coil 105 and the sensing coil 107 are formed on each of the layers 111, 113, 115, 117. In the first layer 111, the excitation coil 103 comprises windings 119, in the second layer 113, the excitation coil 103 comprises windings 121, in the third layer 115, the excitation coil 103 comprises windings 123 and in the fourth layer 117, the excitation coil comprises windings 125, wherein the windings 119, 121, 123, 125 of the excitation coil 103 are electrically connected to each other using conductive through-holes or vias 127. In each layer 111, 113, 115, 117, for example 10 to 20 windings may be arranged. Also, the sensing coil 105 comprises in the first layer 111 the windings 129, comprises in the second layer 113 the windings 131, comprises in the third layer 115 the windings 133 and comprises in the fourth layer 117 the windings 135. The sensing coil 107 comprises in the first layer the windings 137, in the second layer the windings 139 and in the third layer the windings 141 and in the fourth layer the windings 143 which may be configured as the windings 129, 131, 133, 135 of the sensing coil 105 which may also be configured as the windings 119, 121, 123 and 125 of the excitation coil 103, in particular also comprising the conductive through-holes 127 for connecting the winding portions in the different layers electrically with each other.

As can be taken from FIG. 1, the windings 129 of the sensing coil 105, the windings 119 of the excitation coil 103 and the windings 137 of the sensing coil 107 are arranged coplanar to each other in the same layer 111 of the layer structures 101. Other windings of the excitation coil 103 and the sensing coils 105, 107 are also arranged on or in a same layer and are arranged coplanar and adjacent to each other.

Figure 2:
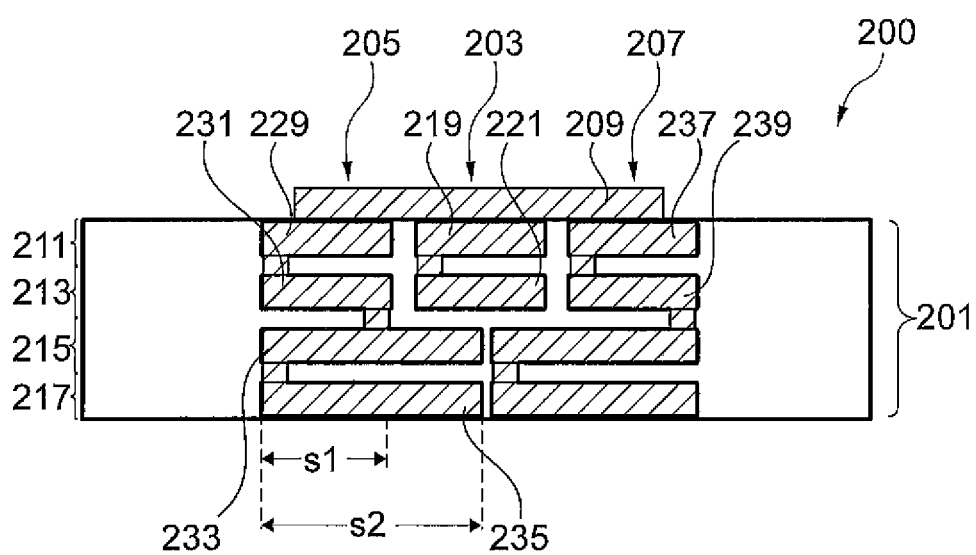
FIG. 2 schematically illustrates in a side view a component carrier according to an embodiment.

The component carrier 200 schematically illustrated in a side view in FIG. 2 also comprises in the stack 201 of layers a first layer 211, a second layer 213, a third layer 215 and a fourth layer 217. However, the excitation coil 203 comprises only windings 219 and 221 in the first layer 211 and the second layer 213 but not in the third and fourth layer 215, 217. In the first layer 211 and the second layer 213, the windings 229 and 231 of the sensing coil 205 and the windings 237 and 239 of the sensing coil 207 are coplanar with the windings 219 and 221 of the excitation coil 203. In the first layer 211 and the second layer 213, the sensing coils 205, 207 have a lateral extension s1 while in the third layer 215 and the fourth layer 217, the sensing coils 205, 207 have a lateral extension s2 which is larger than s1, in particular between 1.5 and 1.9 times the extension s1.

In the embodiments illustrated in FIGS. 1 to 15, the respective excitation coil is configured to generate an alternating magnetic field which magnetizes the first magnetic structure (above the excitation coil and the sensor coils) into saturation.

Figure 3:
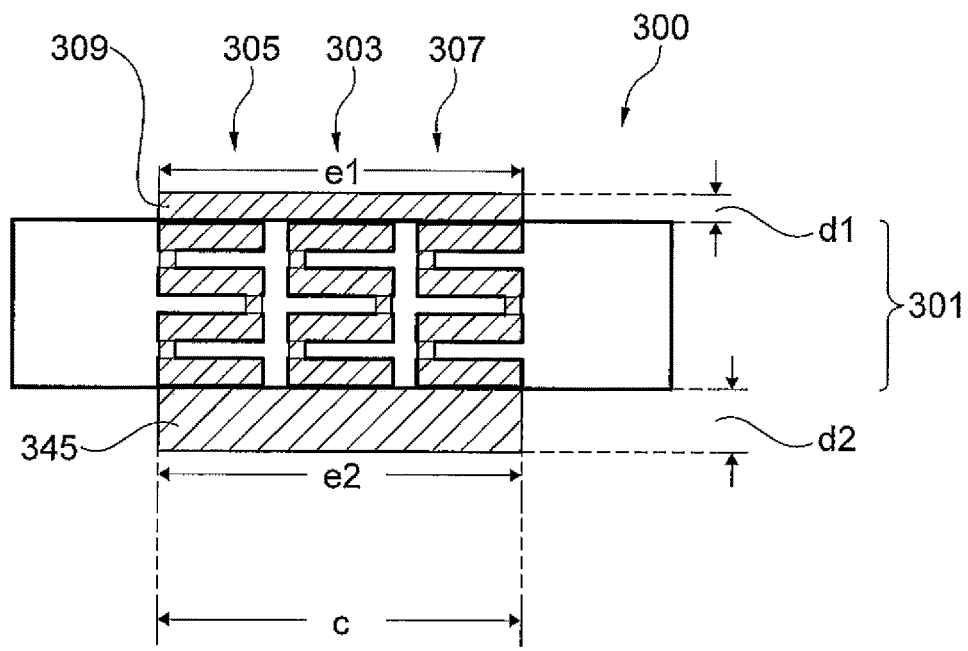
FIG. 3 schematically illustrates in a side view a component carrier according to an embodiment.
Figure 4:
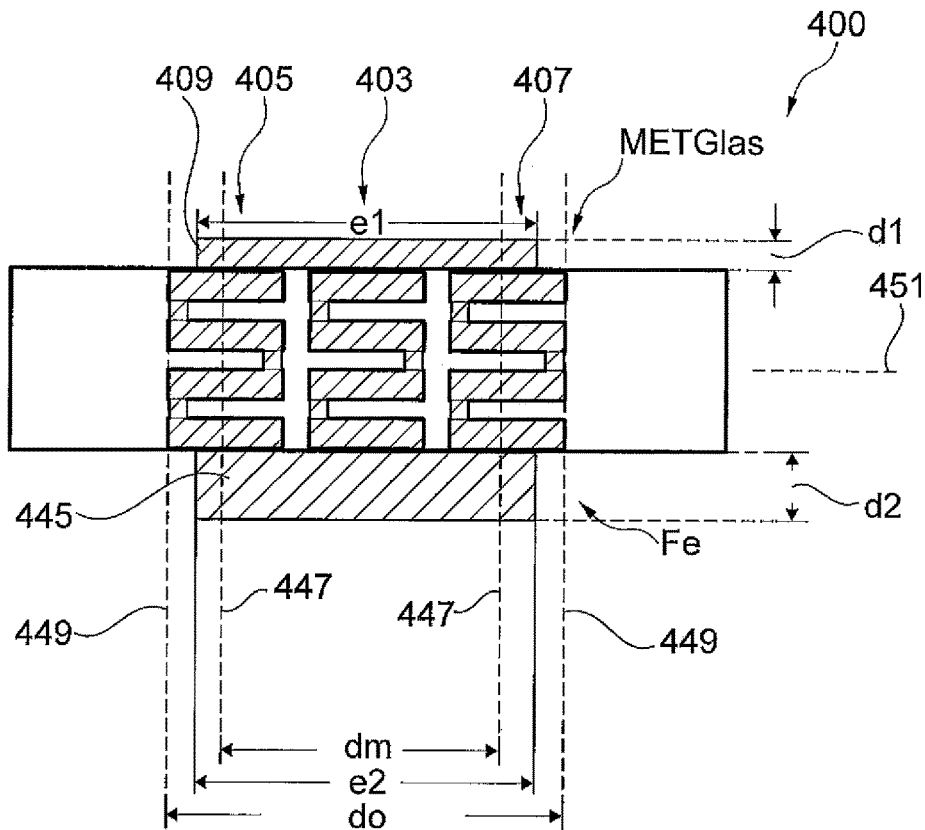
FIG. 4 schematically illustrates in a side view a component carrier according to an embodiment.
Figure 5:
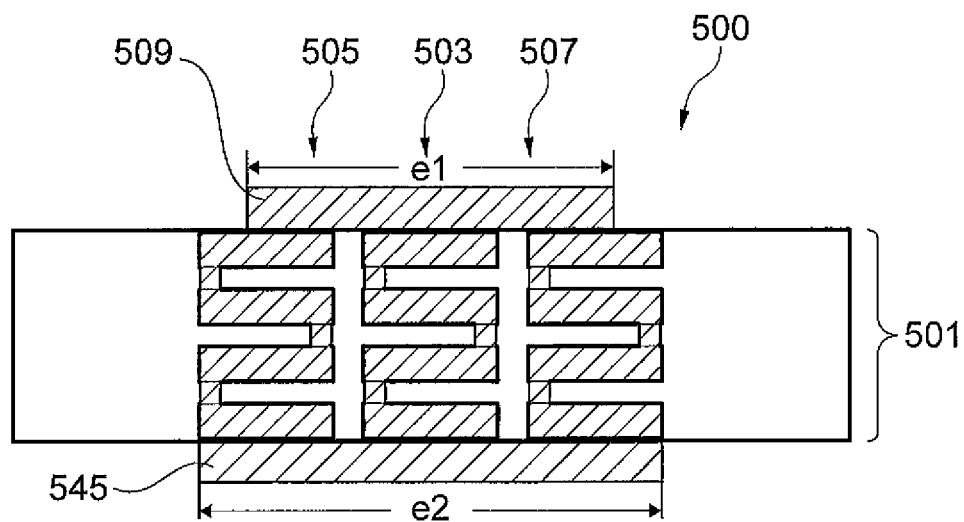
FIG. 5 schematically illustrates in a side view a component carrier according to an embodiment.

FIGS. 3, 4 and 5 schematically illustrate in a side view other embodiments of a component carrier which are similar to the embodiments illustrated in FIGS. 1 and 2 but which comprise a second magnetic structure 345 below the excitation coil 303 and the sensing coils 305, 307 referring for example to FIG. 3. The second magnetic structure 345, 445, 545 of the component carrier 300, 400, 500, respectively, illustrated in FIGS. 3, 4, 5, respectively, may be made of a material which is different from the material of the first magnetic structure 309, 409, 509, respectively. Further, the thickness d1 of the first magnetic structure 309 may be smaller than the thickness d2 of the second magnetic structure 345. This may be the case when the second magnetic structure 345 is composed of a transformer soft magnetic material or a metal sheet. Both, the material of the first and the material of the second magnetic structure may be made of a highly magnetically permeable material. The saturation induction of the material of the first magnetic structure may be different from the saturation induction of the material of the second magnetic structure. The material of the first magnetic structure 309 may for example be MetGlas 2714A (having saturation induction of 0.57 T) and the second magnetic structure may for example comprise Vitrovac 6155U55F (having saturation polarization of 0.99 T, having a composition in atomic % of 73% Co, 5% Fe, 5% Si, 17% B). MetGlas 2714A may have a steep hysteresis, while Vitrovac 6155U55F may have a less steep hysteresis curve. The lateral extension e1 of the first magnetic structure 309 may substantially be equal to a lateral extension c of combination of the sensing coil 305, the excitation coil 303 and the sensing coil 307. The lateral extension e2 of the second magnetic structure 345 may substantially be equal to the lateral extension e1 of the first magnetic structure and also be substantially equal to the lateral extension c of the coils 305, 303, 307.

In the embodiment of the component carrier 400 illustrated in FIG. 4, the extension e1 of the first magnetic structure 409 and also the extension e2 of the second magnetic structure 445 is smaller than the lateral extension c of the combination of the coils 405, 403 and 407. In particular, the extension e1 as well as the extension e2 may be in a range between the distance dm between mid-points 447 of the sensing coils 405, 407 and the distance do of lateral outer ends 449 of the sensing coils 405 and 407. The lateral extension e1 of the first magnetic structure 409 as well as the lateral extension e2 of the second magnetic structure 445 are preferably not lower than the distance dm between the mid points 447 of the sensing coils 405, 407.

In the component carrier 500 illustrated in FIG. 5, the lateral extension e1 of the first magnetic material is smaller than the lateral extension c of the coils but the lateral extension e2 of the second magnetic material 545 is substantial equal to the lateral extension of the coils 505, 503, 507.

In the embodiment illustrated in FIG. 4, since depending on the configuration of the excitation coil 403, saturation of the first magnetic structure 409 may also be achieved when the lateral extension e1 is smaller than the extension of the coils.

In general, the first magnetic structure as well as the second magnetic structure may be integrally formed and may be continuous without being divided.

By designing and constructing the first magnetic structure 509 in FIG. 5 to have a lateral extension e1 to be smaller than the lateral extension c of the sensing coil 505, the excitation coil 503 and the sensing coil 507, a linearization of the voltages induced in the sensing coils 505, 507 depending on the magnitude of the external field may be achieved.

The embodiments 600 and 700 of a component carrier illustrate schematically in an elevational view embodiments providing a 2D flux gate sensor in different configurations. In the embodiments illustrated in FIGS. 6 and 7, one excitation coil and four sensing coils are provided on a common dielectric layer such that all coils are coplanar to each other.

Figure 6:
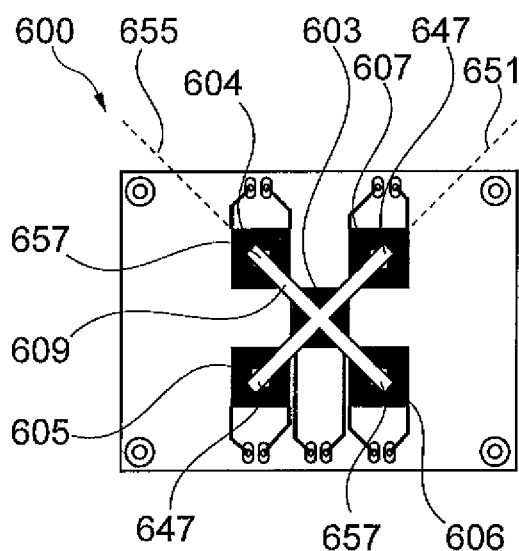
FIG. 6 and FIG. 7 schematically illustrate in an elevational view a component carrier according to an embodiment configured as a 2D flux gate sensor.

In the embodiment of the component carrier 600 illustrated in FIG. 6, the sensing coils 605 and 607 are adjacent to the central excitation coil 603, wherein outer corners of the excitation coil 603 are closest to outer corners of the sensing coils 605, 607. A straight line 651 connecting lateral mid points 647 of the sensing coils 605, 607 runs through a mid-point 653 of the excitation coil 603. The sensing coils 605, 607 are capable of measuring a component of the external field parallel to the straight line 651. Further sensing coils 604 and 606 are arranged such that a straight line 655 connecting mid-points 657 of the coils 604, 606 is oriented perpendicular to the straight line 651. The first magnetic structure 609 is shaped in a cross-shape, one arm running along the straight line 651, the other arm running along the straight line 655.

Figure 7:
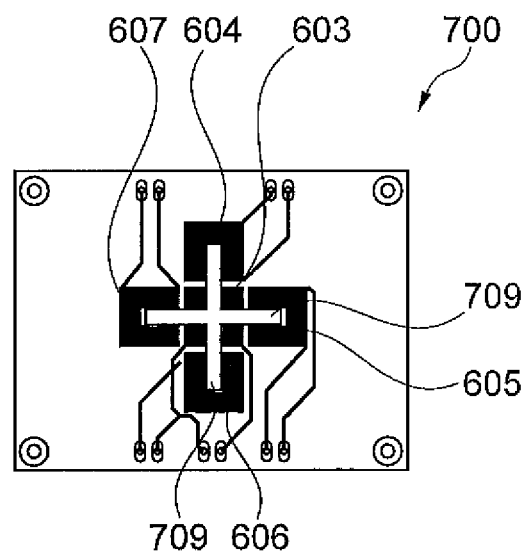
Figure 11:
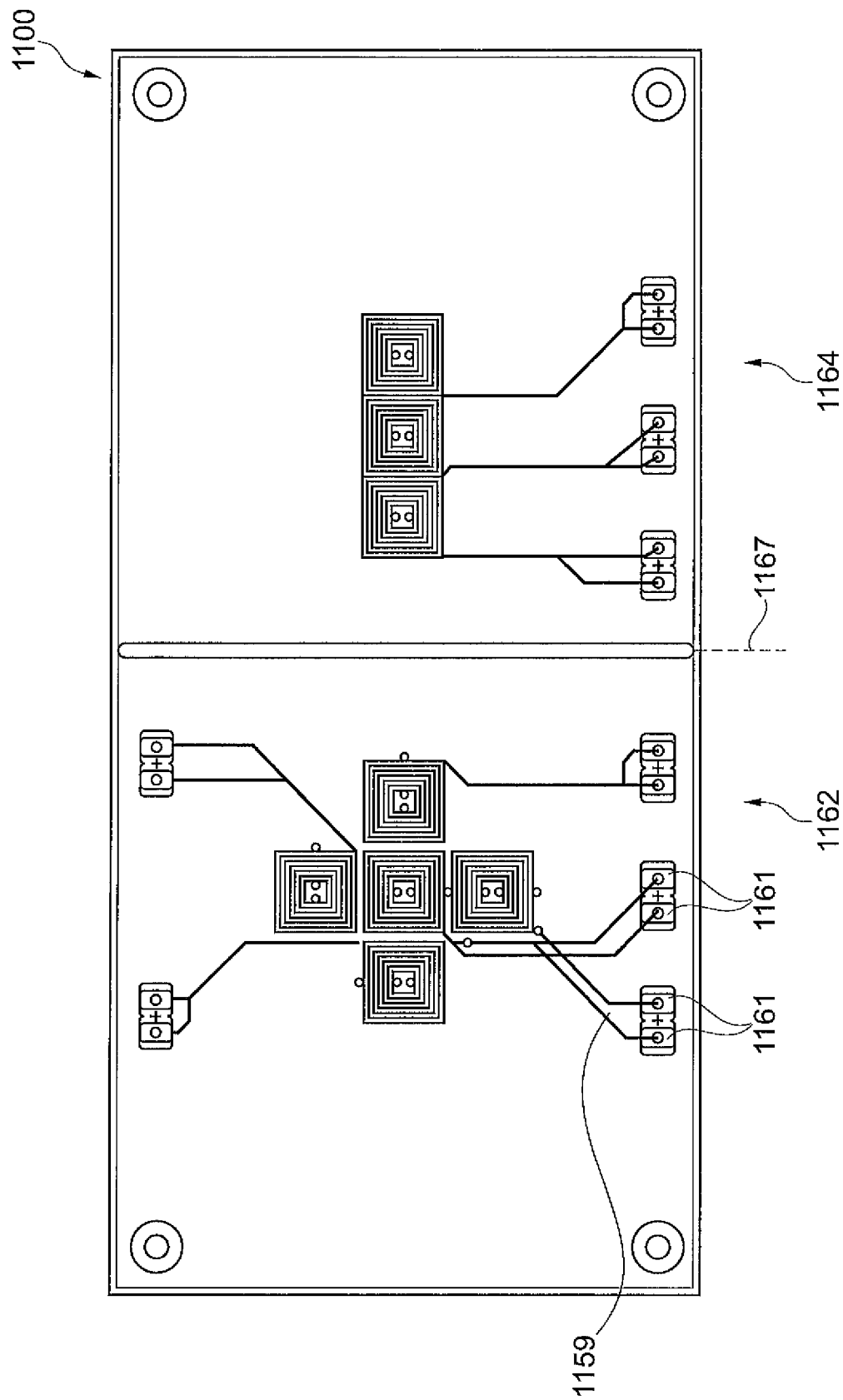
FIG. 11 schematically illustrates in an elevational view an intermediate step for manufacturing a component carrier configured as 3D flux gate sensor according to embodiments.

The embodiment 700 of a component carrier according to an embodiment illustrated in FIG. 7 in an elevational view has the excitation coil 603 and the sensing coils 604, 605, 606, 607 arranged such that a side edge of the central excitation coil 603 and a respective side edge of the four sensing coils are arranged adjacent to each other. The first magnetic structure 709 also comprises two arms, one arm running along a straight line connecting the coils 605, 607, the other arm running along a line connecting mid points of the sensing coils 604, 606. Thereby, a compact configuration is achieved.

The embodiments illustrated in FIGS. 6 and 7 may further comprise a second magnetic structure below the excitation and sensing coils.

FIGS. 8 and 9 schematically illustrate embodiments 800 and 900 of a component carrier providing a 1D flux gate sensor. In the illustrated embodiment, four layers are provided each layer having 15 windings of the respective sensing coil 805, 807 and the excitation coil 803. A 75 μm line space technology is applied. The horizontal extension may be for example 18 mm and the vertical extension may be 6 mm of the coils. The embodiment illustrated in FIG. 9 provides an extension of the coils of 15 mm×6 mm, while the extension of the coil in the embodiment illustrated in FIG. 8 is 18 mm×6 mm. Other extensions may be possible.

FIG. 10 illustrates a component carrier 1000 according to an embodiment in a perspective view. Four layers 1011, 1013, 1015 and 1017 each having winding portions of the sensing coils as well as the excitation coil formed thereon are stacked on top of each other. Electrical connection traces 1059 lead away from the coils to terminals 1061 for connecting the sensing coils 1005, 1007 to detection circuitry and connecting the excitation coil 1003 to a driver circuitry. The component carrier 1000 may further comprise a first magnetic structure above the coil and a second magnetic structure below the coils which may be configured as the magnetic structures illustrated for example in FIG. 1 to 5, 6, 7 or 9.

Figure 12:
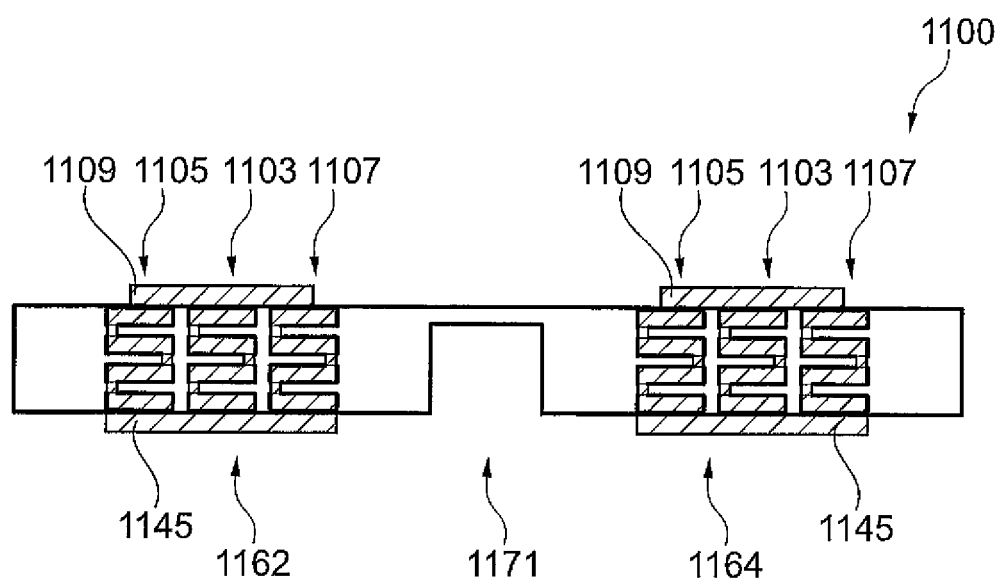
FIGS. 12 and 13 schematically illustrate method step for manufacturing a component carrier with integrated 3D flux gate sensor according to an embodiment.
Figure 13:
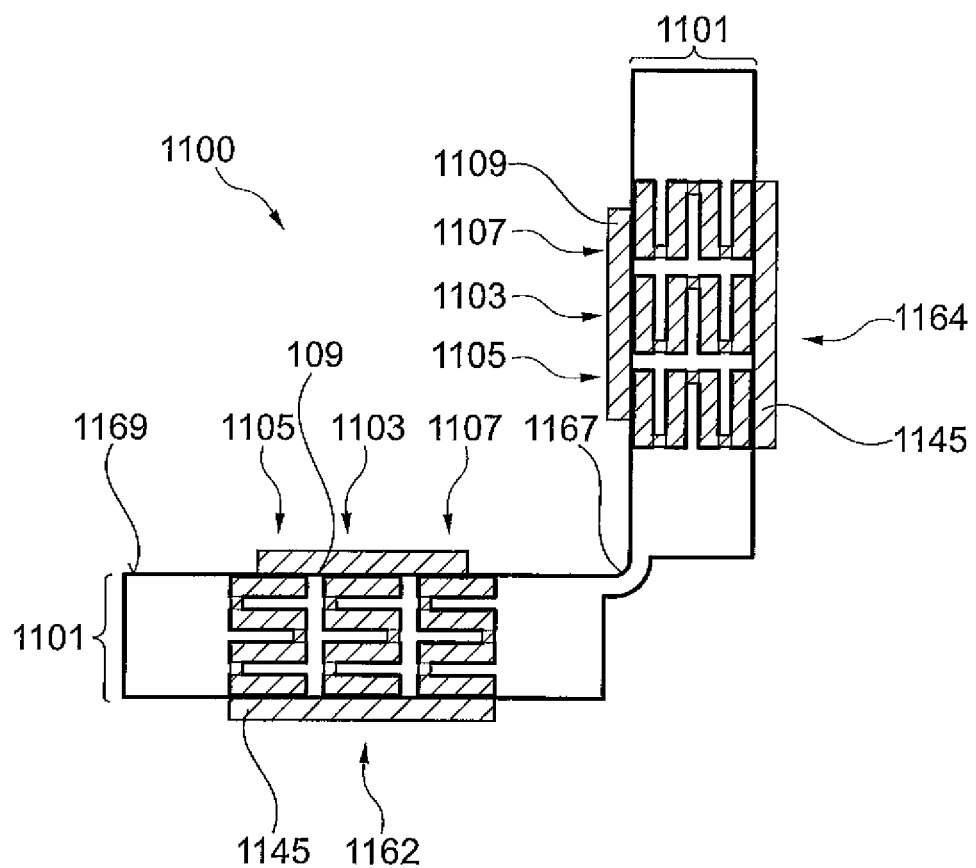

FIGS. 12, 13 illustrate in an elevational view and in a side view steps for manufacturing a component carrier with integrated 3D flux gate sensor according to an embodiment. Thereby, the component carrier 1100 is manufactured starting from a layer structure illustrated in FIG. 11 in an elevational view having a first region 1162 and a second region 1164 being coplanar to each other. In the first region 1162, a 2D flux gate sensor is implemented, which may be similar to the component carrier with integrated 2D flux gate sensor 700, as is illustrated in FIG. 7. At an upper side, the first and second regions 1162, 1164 may comprise a first magnetic structure and on a lower side, the first and second regions 1162, 1164 may comprise a second magnetic structure, which may be configured for example as is illustrated in side views in FIGS. 3, 4, 5 or in elevational views configured as illustrated in FIGS. 6 and 7.

In the second region 1164, the component carrier 1100 comprises a 1D flux gate sensor which may be configured similar to flux gate sensor 800 or 900 as illustrated in FIGS. 8 and 9. Thus, the 2D flux gate sensor in first region 1162 and the 1D flux gate sensor in the second region 1164 are initially in a coplanar arrangement essentially in a plane or several common planes harboring windings as may depend on the particular application. Furthermore, terminals 1161 being connected with the different coils via connecting lines 1159 are provided for electrically contacting the coil with driver or detection circuitry. The side view of the component carrier 1100 in this intermediate method step is illustrated in FIG. 12.

In a next method step, the component carrier 1100 is modified in that the second region 1164 is bent relative to the first region 1162 by 90° around a bending axis 1167 which lies in a frontal plane 1169 of the stack 1101 of layers within which the excitation coil and the sensing coil are integrated. In the side views as illustrated in FIGS. 12 and 13, also the first magnetic structure 1109 on an upper side and the second magnetic structure 1145 can be seen which may be configured similar to those as illustrated in embodiments 300, 400, 500, 600, 700 in FIGS. 3, 4, 5, 6 and 7, respectively.

Thus, to manufacture the 3D flux gate sensor it is started with a 2D design and a 1D design which are arranged coplanar and side by side. For enabling bending the two regions relatively to each other, a cavity 1171 is provided between the first region 1162 and the second region 1164. The cavity 1171 may have been generated by 2.5 D technology, essentially removing portions of the layer structure. The finalized component carrier 1100 as illustrated in FIG. 13 may then be supported with auxiliary support equipment for enhancing mechanical strength. For example, the component carrier may be encapsulated with resin or injection molding.

Figure 14:
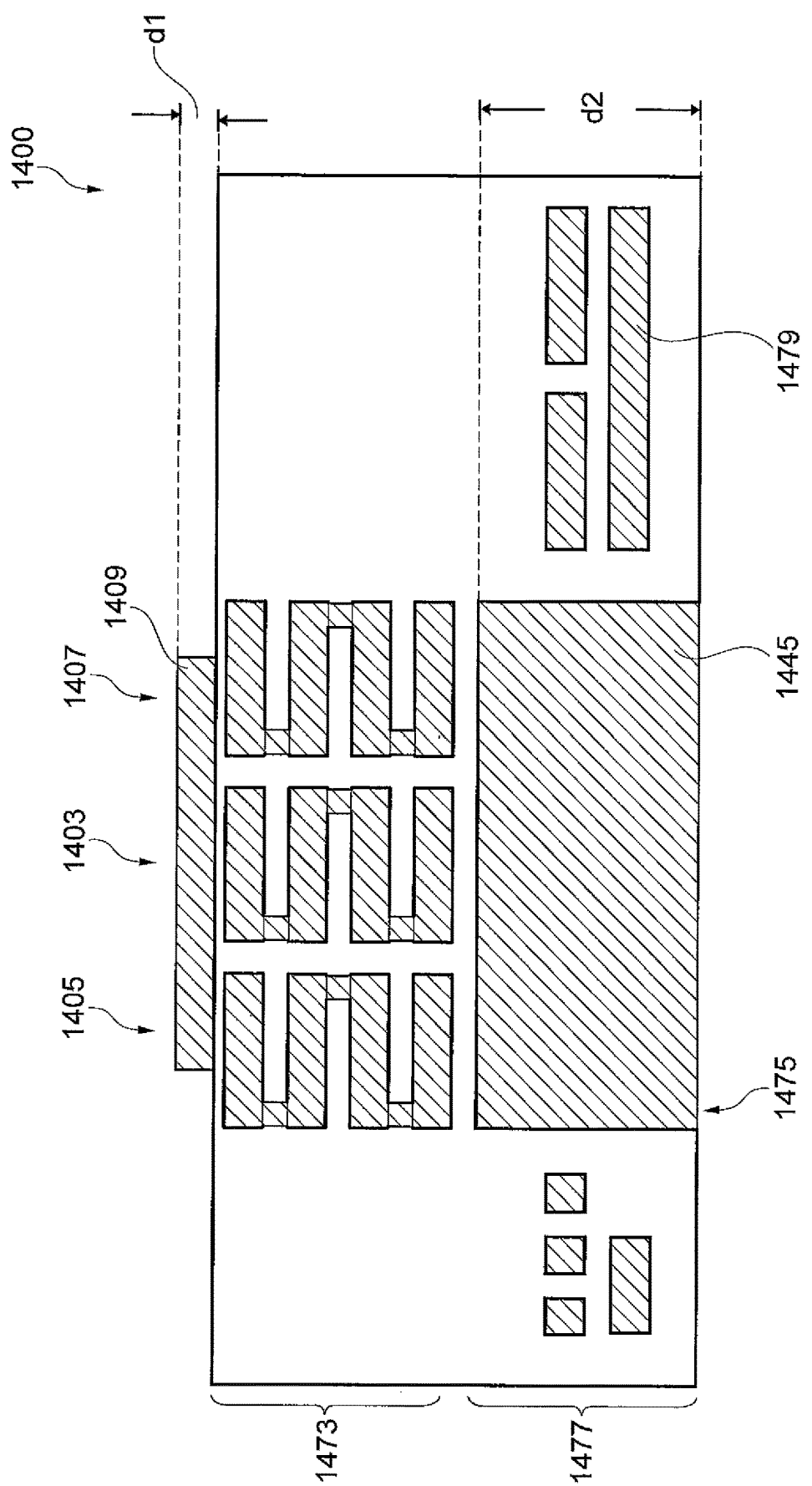
FIG. 14 illustrates in a schematic side view a component carrier according to a still further embodiment.

FIG. 14 schematically illustrates a component carrier 1400 in a schematic side view according to still another embodiment. The upper portion of the component carrier 1400 which is labeled with reference sign 1473 may be configured similar to the component carrier 100 or 200 as illustrated in FIG. 1 or 2, respectively. Using 2.5 D technology, a cavity 1475 has been created in the multi-layer structure 1477 comprising a plurality of dielectric layers and/or electrically conductive layers which may harbor other electric and/or electronic components and/or copper traces. In the cavity 1475, a thick second magnetic structure 1445 is inserted which may act similar to the second magnetic structure as illustrated in FIGS. 3, 4, 5, 6, 7 for example. Thereby, it is enabled to integrate a second magnetic structure 1445 that has a relatively great thickness d2 which is much larger than the thickness d1 of the first magnetic structure 1409 above the sensing coils and excitation coil. Further, electric and/or electronic components or integrated circuits 1479 may be integrated in the multi-layer structure 1477.

Figure 15:
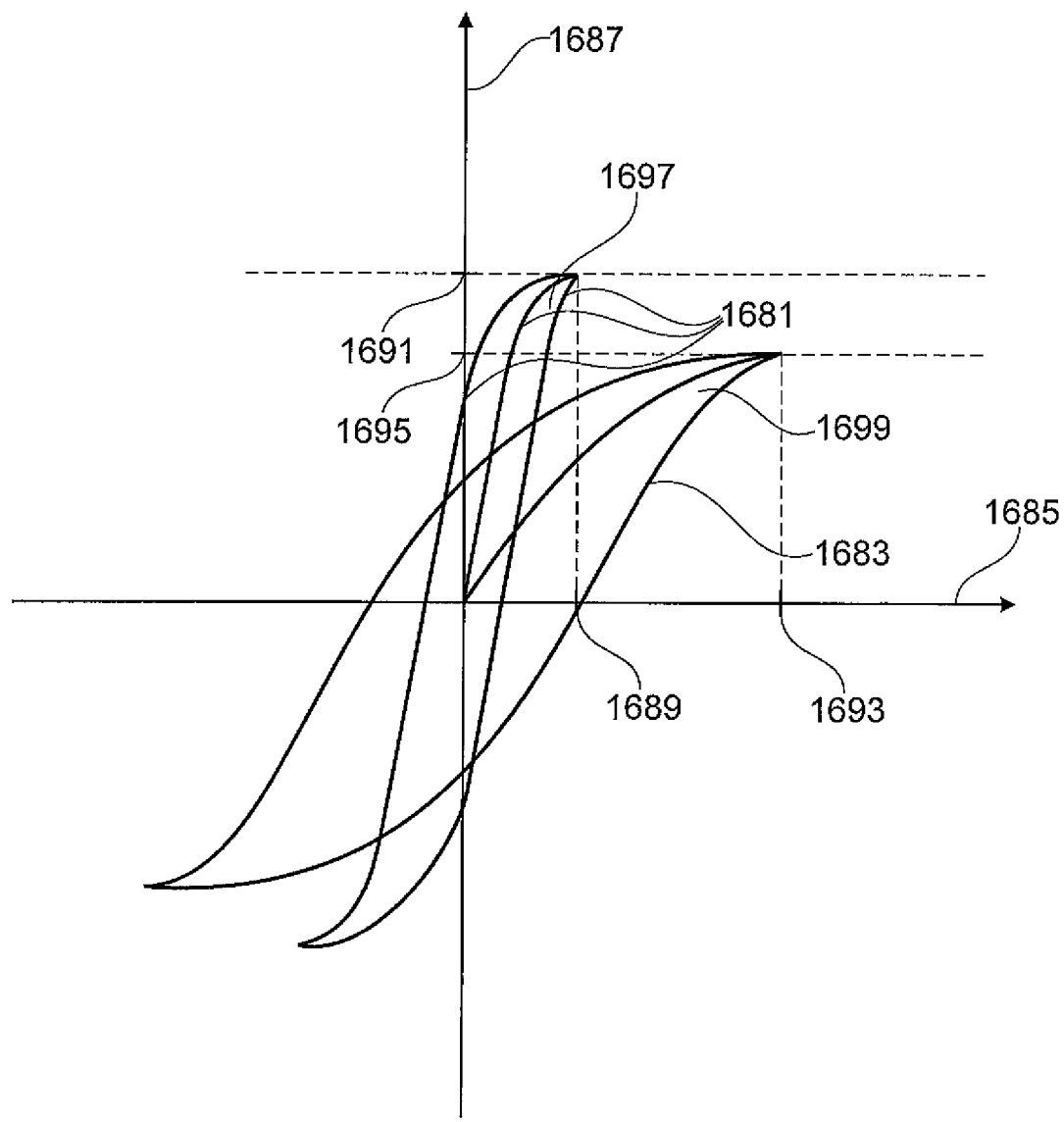
FIG. 15 illustrates hysteresis curves of material as used in a component carrier according to an embodiment.

FIG. 15 illustrates a graph with hysteresis curves 1681 of a material of the first magnetic structure and a hysteresis curve 1683 of a material of the second magnetic structure. Both are narrow hysteresis curves of soft magnetic materials. Therein, on the abscissa 1685, the magnetizing field is indicated while on the ordinate 1687, the resulting magnetization is indicated. As can be appreciated from FIG. 16, the hysteresis curve 1681 has a larger steepness than the hysteresis curve 1687. Further, the external field 1689 where the material of the first magnetic structure reaches its saturation magnetization 1691 is smaller than the magnetizing field 1693 where the material of the second magnetic structure reaches its saturation magnification 1695. Further, the area within the hysteresis loop of the material of the first magnetic structure (area 1697) is much smaller than the area 1699 within the hysteresis loop of the hysteresis curve 1683 of the material of the second magnetic structure. The saturation induction 1695 of the second magnetic structure may be lower or higher than the saturation induction 1691 of the material of the first magnetic structure.

The second magnetic structure may be configured as a stripe which may be relatively thick which has a high magnetic permeability and a hysteresis curve which may contribute to the formation and amplification of the magnetic circuit. This may be a boundary condition for designing the second magnetic structure. Closing the magnetic circuit across the edges may not be necessary since due to the aspect ratio, the field may not be guided like in the traditional sense of 3D coil assemblies. Different materials may contribute to improving the performance of the flux gate sensor. The flux gate sensor may have a higher sensitivity than conventional flux gate sensors. Further, energy consumption or required current may be lower than conventionally known. By appropriately combining differently selected materials of the first magnetic structure and the second magnetic structure, several advantages are achieved. The first magnetic structure may achieve magnetic saturation during operation, while the second magnetic structure may not reach saturation. The lower magnetic structure may for example be formed from an iron foil.

Figure 16:
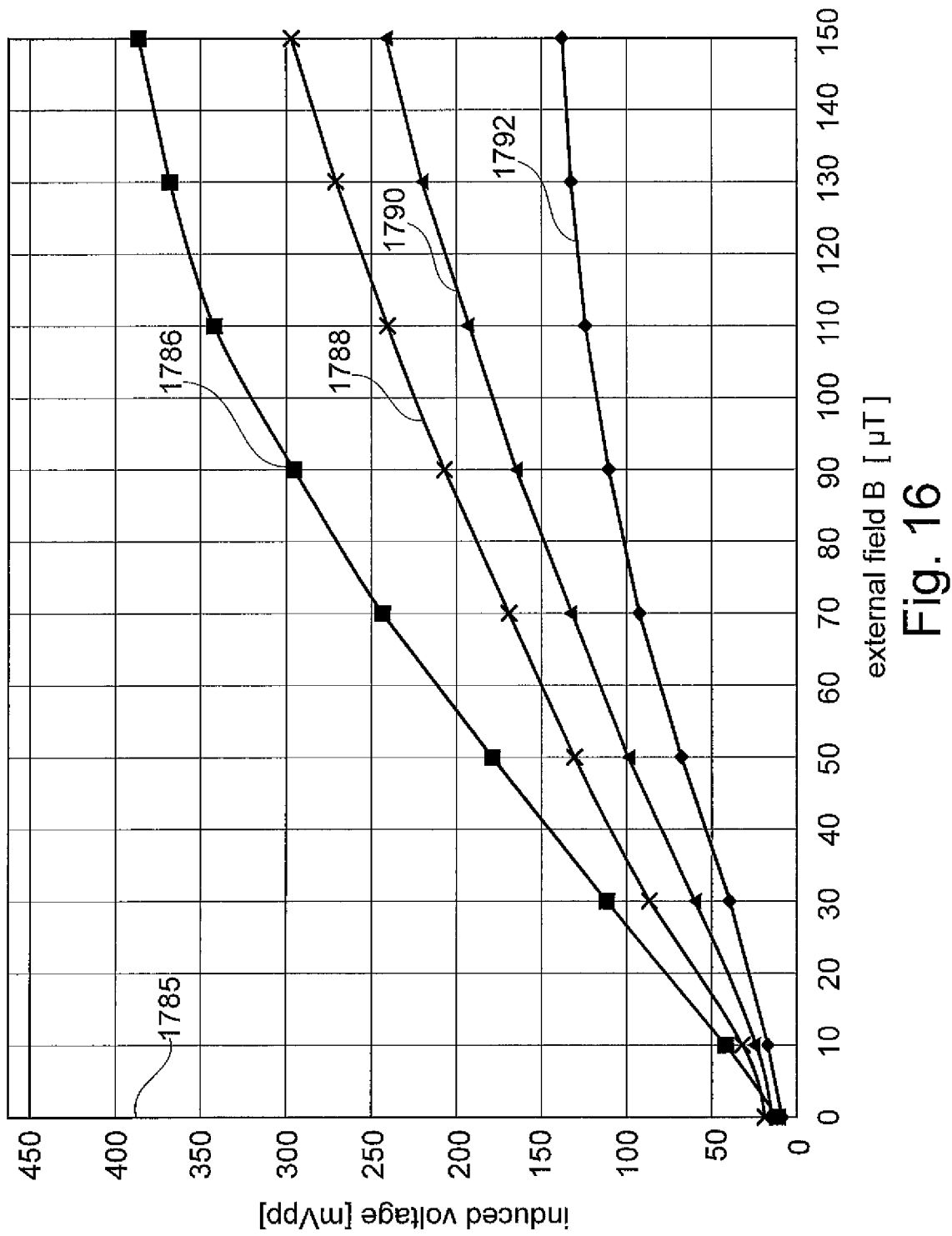
FIGS. 16 and 17 illustrate experimental results.

FIG. 16 illustrates curves 1786, 1788, 1790, 1792 of the induced voltage (on ordinate 1785) in the sensing coils in dependence of the external field (on abscissa 1784) for a wound magnetic core, a flux gate sensor having as the second magnetic structure a transformer sheet, a flux gate sensor having as the second magnetic structure a closed iron and a conventional flux gate sensor having no second magnetic structure, respectively. As can be appreciated from FIG. 16, the curves 1788, 1790 corresponding to measurement results of flux gate sensors according to embodiments are superior compared to a conventional flux gate sensor as characterized by curve 1792.

Thereby, the voltage at the excitation coil was about 17 V. The external field was increased from 0 to 150 µT and the voltage at the sensing coils was measured.

Figure 17:
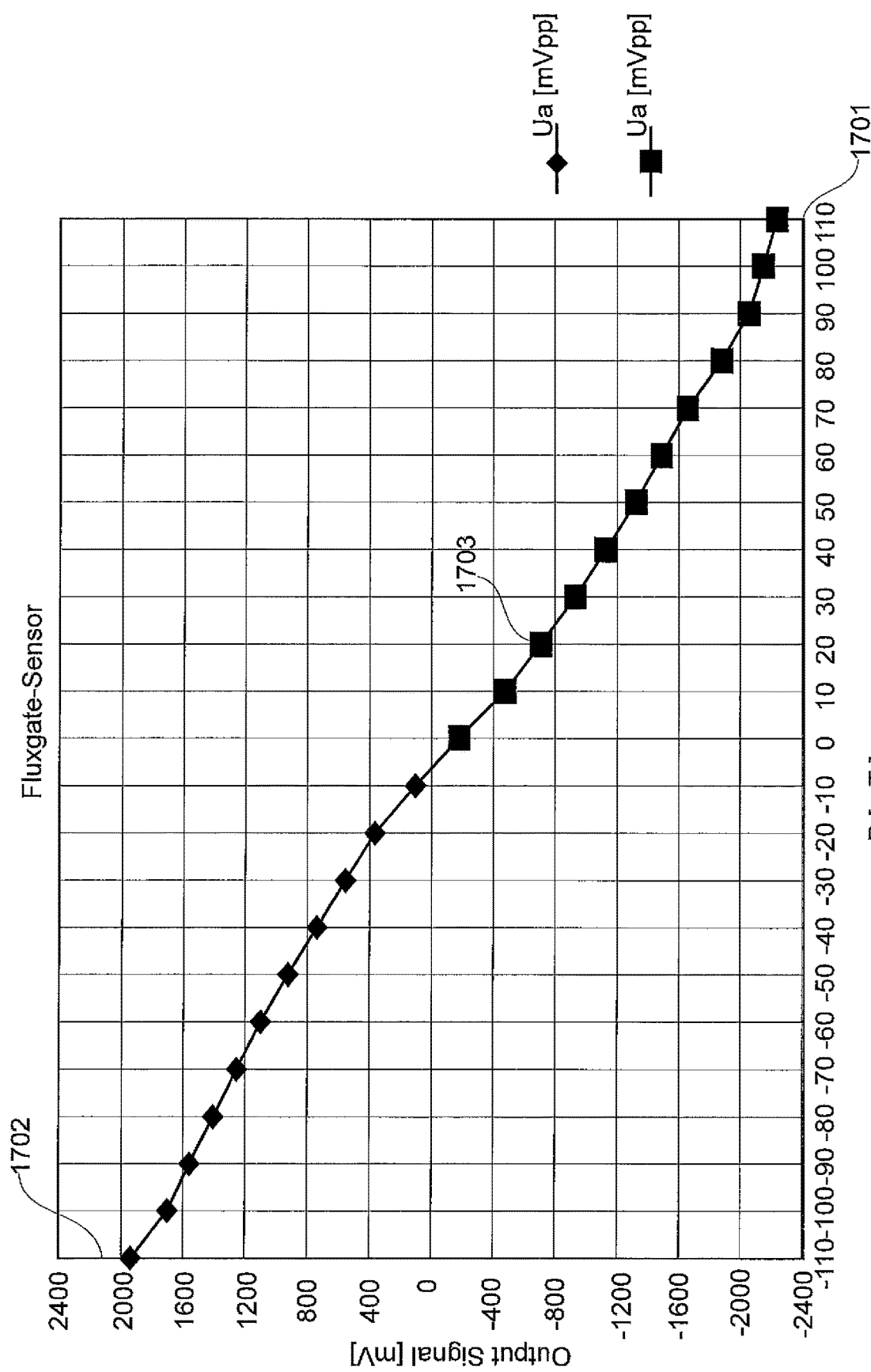

In the finalized flux gate sensor, the external magnetic field to be measured may be derived to be proportional to the amplitude of the second harmonic of the frequency of the excitation voltage. Such a curve 1703 is illustrated in FIG. 17 as measured using a flux gate sensor according to an embodiment. The excitation current was about 100 mA (10 Ohm coil resistance). The external field (on abscissa 1701) was varied from −110 to 110 µT and the amplitude (on ordinate 1702) of the second harmonic of the voltage at the sensing coils was measured. The curve 1703 shows a good linearity and high sensitivity of about 4.5 mV/µT. Excitation frequency was 100 kHz.

A main idea according to embodiments is that a soft magnetic core (e.g. µ-metal) which guides and "collects" the magnetic field is placed on top of the coil separated by a thin dielectric layer (which may be needed to avoid electrical shorts of the coils (i.e. the excitation coil and the sensing coil)) and may serve as a glue to hold the foil. Critical properties of the used p metal may be a sharp kink in its hysteresis curve and a very high permeability to get into saturation during operation. Additionally, on the bottom side of the setup, a second metal foil may be placed. The line/space ratio of the coils may have a significant influence on the input/output signal ratio. The smaller the line/space ratio is (equals in a higher amount of convolutions), the more voltage may be needed to be induced as the resistivity of the track increases as well as the other way round. A typical L/S ratio may be 75 µm (3 mil) to 50 µm (2 mil), copper thickness may vary from typically 12 µm to 35 µm, to keep the voltage at a lower level. It is also possible to have the copper thickness range from 6 µm up to 150 µm. The insulating material on the coils may be printed (inkjet, screen-printing) or laminated with a thin FR4 material.

Further possibilities for placing the metal sheet (in particular second magnetic structure) may be: embedding (ECP, center core), deposition of the metal with PVD (sputtering or wet chemistry) (galvanic plating), full surface re-lamination and photo-structuring.

As the metal sheet (in particular second magnetic structure) may establish increasing/guiding the magnetic field, it may also be possible to apply just a layer of glue and cover this layer with a protection foil. Later this foil may be removed and the flux gate may be placed anywhere on a metal sheet (for example somewhere in a car, ship). This may have a similar or same effect as the metal sheet.

The length or lateral extension of the high permeable soft magnetic materials (such as the first and/or second magnetic structure) may have a big influence on the performance of the flux gate sensor.

Embodiments may provide the following advantages:
Lower power requirements than a simple core
Miniaturization through HDI technology
Combination with 2.5 D technology
Reduction of components on/in PCB
Increased reliability
Cost efficiency
Simple processing/manufacturing
No overlap of coil
Current/EMV measurement The second magnetic structure may be glued at the bottom.

The disclosed layer assembly may enable to implement the fluxgate sensor in different laminates. Further, downsizing may be achieved by applying different manufacturing methods, such as e.g. MSAP process or by using semiconductor technology applying CMOS processes on silicon substrates.

The invention claimed is:

1. A component carrier with an integrated magnetic field sensor, the component carrier comprising:
    layer structures comprising a plurality of electrically conductive layer structures and/or electrically insulating layer structures;
    an excitation coil and sensor coils arranged on the layer structures;
    a first magnetic structure above the excitation coil and the sensor coils;
    a second magnetic structure below the excitation coil and the sensor coils.

2. The component carrier according to claim 1, wherein the excitation coil and the sensor coils are arranged at least partially coplanar on the layer structures.

3. The component carrier according to claim 1, wherein the first magnetic structure and the second magnetic structure are made of a soft magnetic material having a high maximum DC magnetic permeability, the material comprising at least one of:
    a crystalline metal alloy,
    a polycrystalline metal alloy,
    an amorphous metal alloy.

4. The component carrier according to claim 1, wherein the first magnetic structure and the second magnetic structure are composed of different materials and are configured as one of a foil and a sheet.

5. The component carrier of claim 1, wherein at least one of the following is satisfied:
    the material of the first magnetic structure is characterized by a steeper hysteresis curve than the material of the second magnetic structure,
    a magnetizing field at which a permeability is maximal is smaller for the material of the first magnetic structure than for the material of the second magnetic structure,
    a magnetic reversal loss is smaller for the material of the first magnetic structure than for the material of the second magnetic structure,
    the material of the second magnetic structure requires a higher external field strength to reach magnetic saturation than the first magnetic structure.

6. The component carrier according to claim 1, wherein the excitation coil, the first magnetic structure and the second magnetic structure are configured such that the excitation coil generates an alternating magnetic field that saturates a magnetization in the first magnetic structure, while not saturating the magnetization in the second magnetic structure.

7. The component carrier according to claim 1, wherein the plurality of electrically conductive layer structures and/or electrically insulating layer structures comprises electrically insulating layers, wherein at least one of the excitation coil and the sensor coils comprises conductive windings formed on at least one or more dielectric layers of the insulating layers.

8. The component carrier according to claim 7,
    wherein the at least one or more dielectric layers on which the windings of the excitation coil and the windings of the sensor coils are formed are the same at least one dielectric layer.

9. The component carrier according to claim 1, wherein an area of a lateral extension of the first magnetic structure and an area of a lateral extension of the second magnetic structure is smaller than a sum of areas of lateral extensions of the excitation coil and the sensor coils.

10. The component carrier according to claim 1, wherein a lateral shape of the first magnetic structure and the second magnetic structure substantially equals a shape of a lateral region covered by the excitation coil and the sensor coils.

11. The component carrier according to claim 1, wherein at least one of the excitation coil and the sensor coils has windings formed as at least one spiraled square and a rectangle, two of the sensor coils being arranged adjacent to the excitation coil such that lateral mid points of the two sensor coils are connectable by a straight line running through a lateral mid-point of the excitation coil, the straight line in particular running through corners of windings of the excitation coil or running through and perpendicular to side edges of windings of the excitation coil.

12. The component carrier according to claim 1,
    wherein an amount of an extension of the first magnetic structure and the second magnetic structure along the straight line is between a distance of the lateral mid points of the two sensor coils and a distance between ends of the two sensor coils along the straight line.

13. The component carrier according to claim 1, wherein the plurality of electrically conductive layer structures and/or electrically insulating layer structures comprise electrically insulating layer structures,
    wherein the number of excitation coils is at least two, the number of sensor coils is at least six,
    wherein four of the sensor coils and one excitation coil are arranged substantially in a coplanar arrangement, the other two sensor coils and one other excitation coil are oriented perpendicular to the coplanar arrangement on the same electrically insulating layer structures in a region laterally beside the four sensor coils, the region being bent substantially 90°.

14. The component carrier according to claim 1, operable in a first and a second operation mode,
    wherein during the first operation mode saturation of magnetization occurs in the first magnetic material but not in the second magnetic material resulting in improved energy efficiency,
    wherein during the second operation mode saturation of magnetization occurs in both the first magnetic material and the second magnetic material resulting in increased sensitivity.

15. A method of manufacturing a component carrier with an integrated magnetic field sensor, the method comprising:
    connecting layer structures comprising a plurality of electrically conductive layer structures and/or electrically insulating layer structures;
    forming an excitation coil and sensor coils on the layer structures;
    forming a first magnetic structure to be above the excitation coil and sensor coils; and
    forming a second magnetic structure to be below the excitation coil and sensor coils.

16. The component carrier according to claim 3, wherein the metal alloy comprises at least one of Co, Ni, Si, Fe, Mo, mu-metal a type of MetGlas, a type of Virovac.

17. The component carrier according to claim 8, wherein the plurality of electrically conductive layer structures and/or electrically insulating layer structures comprise dielectric layers,
    wherein some of the dielectric layers have formed thereon windings of the excitation coil and windings of the sensor coils, while others of the dielectric layers have formed thereon no windings of the excitation coil but windings of the sensor coils.

\* \* \* \* \*